United States Patent [19]
Wolf

[11] Patent Number: 4,851,367
[45] Date of Patent: Jul. 25, 1989

[54] METHOD OF MAKING PRIMARY CURRENT DETECTOR USING PLASMA ENHANCED CHEMICAL VAPOR DEPOSITION

[75] Inventor: David J. Wolf, Auburn Hills, Mich.

[73] Assignee: Eastman Kodak Company, Rochester, N.Y.

[21] Appl. No.: 232,973

[22] Filed: Aug. 17, 1988

[51] Int. Cl.$^4$ .............. H01L 21/00; H01L 21/02; H01L 31/00; H01L 31/02

[52] U.S. Cl. .............................. 437/101; 437/2; 357/2; 357/30

[58] Field of Search ............... 437/101, 2; 357/2, 30

[56] References Cited

U.S. PATENT DOCUMENTS

| | | | |
|---|---|---|---|
| 4,359,514 | 11/1982 | Shimizu et al. | 430/65 |
| 4,536,460 | 8/1985 | Kanbe et al. | 430/57 |
| 4,540,647 | 9/1985 | Borsenberger | 430/136 |
| 4,544,617 | 10/1985 | Mort et al. | 357/2 |
| 4,592,985 | 6/1986 | Ogawa et al. | 430/84 |
| 4,619,877 | 10/1986 | Borsenberger | 430/31 |
| 4,626,885 | 12/1986 | Ishioka et al. | 357/31 |
| 4,634,647 | 1/1987 | Jansen et al. | 430/84 |
| 4,634,648 | 1/1987 | Jansen et al. | 430/84 |
| 4,666,808 | 5/1987 | Kawamura et al. | 430/65 |
| 4,675,264 | 6/1987 | Kawamura et al. | 430/65 |
| 4,675,265 | 6/1987 | Kazama et al. | 430/65 |
| 4,732,833 | 3/1988 | Yoshizawa | 430/65 |
| 4,769,303 | 9/1988 | Ueno | 430/67 |
| 4,778,741 | 10/1988 | Yasui | 430/67 |

OTHER PUBLICATIONS

"Amorphous Semiconductor-Technology and Devices", vol. 6, pp. 325–336.

*Primary Examiner*—Brian E. Hearn
*Assistant Examiner*—B. Everhart
*Attorney, Agent, or Firm*—David F. Janci

[57] ABSTRACT

Disclosed is an improvement in a method of making a primary current detector by plasma enhanced chemical vapor deposition, where a gas mixture comprising a carrier gas, a dopant gas, and silane gas is passed through a plasma in a vacuum chamber thereby forming, on a conductive substrate, deposits of a blocking layer which comprises doped hydrogenated amorphous silicon, and then a photoconductive layer which comprises hydrogenated amorphous silicon. The improvement comprises controlling the process parameters within defined limits while reducing the flow of the silane gas to the vacuum chamber so as to deposit on the photoconductive layer a passivation layer about 0.05 to about 0.5 micrometers thick which comprises hydrogenated amorphous silicon doped with about 100 to about 2000 ppm of a dopant. Also disclosed is a primary current detector made by this method.

16 Claims, 1 Drawing Sheet

METHOD OF MAKING PRIMARY CURRENT DETECTOR USING PLASMA ENHANCED CHEMICAL VAPOR DEPOSITION

TECHNICAL FIELD

The invention relates to a method of making a primary current detector using plasma enhanced chemical vapor deposition, where silane and a dopant gas are passed through a plasma to form a photoconductive layer of hydrogenated amorphous silicon. In particular, it relates to an improvement in such a method wherein, after the photoconductive layer is formed, the process parameters are controlled within defined limits and the flow of silane gas is reduced, which results in the deposition of a passivation layer of hydrogenated amorphous silicon on the photoconductive layer about 0.05 to about 0.5 micrometers thick which has a dopant concentration of about 100 to about 2000 ppm.

BACKGROUND ART

Primary current detectors are devices in which free carriers formed by the absorption of ionizing radiation pass into an external circuit without replenishment. See R. H. Bube, "Photoconductivity in Solids," John Wiley, New York (1960). Such devices include photoconductive elements used in electrostatic copy machines and other devices. Those devices can consist of a conductive substrate on which is mounted a blocking layer and a photoconductive layer of hydrogenated amorphous silicon. Before the photoconductive element is imagewise exposed to light, it must be charged, typically by means of a corona. Between the time of charging and the imagewise exposure to light, the photoconductive element remains in the dark. During this time, the element is subject to dark decay, which means that the charge placed on the element dissipates, either due to the injection of charge from the substrate or from the free surface of photoconductive layer, or by the thermal generation of charge in the material. To the extent that this occurs, the charge on the element is reduced. In addition, if materials from which the element is made are not uniform, the dark decay can occur in a nonuniform manner which can produce noise and a poor quality image. Efforts that have been made to reduce dark decay in these elements have concentrated on placing a barrier layer in between the conductive substrate and the photoconductive layer to prevent charges from passing therebetween. However, these efforts have not proved to be entirely satisfactory.

DISCLOSURE OF INVENTION

It has been discovered that the dark decay of the above-described primary current detector can be greatly reduced by placing over the photoconductive layer a passivation layer of critical thickness and dopant concentration, formed by controlling process parameters within well-defined limits and reducing the flow of silane to the vacuum chamber. Unlike prior methods of reducing dark decay, which attempted to intercept the movement of charges between the photoconductive layer and the conductive substrate, this invention is directed to the free surface of the photoconductive layer. Inexplicably, placing a passivation layer formed according to the method of this invention on the free surface of the photoconductive layer reduces the dark decay and the nonuniformity of the dark decay and therefore results in less noise and better quality images.

BRIEF DESCRIPTION OF DRAWINGS

The accompanying drawing is a diagrammatic isometric view in section showing a certain presently preferred embodiment of a primary current detector made according to the method of this invention.

In the drawing, a primary current detector 1, in the form of a drum, consists of a cylindrical aluminum substrate 2 on which is blocking layer 3 of p-type hydrogenated amorphous silicon. On blocking layer 3 is photoconductive layer 4 of hydrogenated amorphous silicon, and on photoconductive layer 4 is passivation layer 5 formed according to the method of this invention.

BEST MODE FOR CARRYING OUT THE INVENTION

Figure 1:
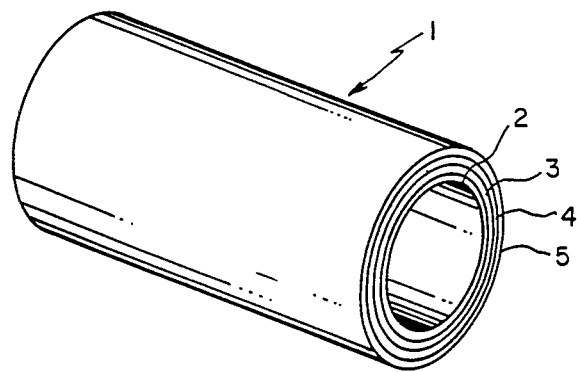

The following is a detailed description of each of the layers in the primary current detector made according to the process of this invention. The conductive substrate provides a support for the other layers of the detector and is not a critical element. Any smooth metal such as aluminum, copper, chromium, or even metal coated glass, can be used to form the conductive substrate.

The amorphous silicon blocking layer prevents the injection of charge from the conductive substrate. As is known in the art, the amorphous silicon is hydrogenated, typically with about 15% hydrogen, in order to reduce the dark conductivity. Hydrogenation occurs during the formation of the layers of the detector because of the presence of hydrogen in the gases used to form the layers. The blocking layer is doped with a p-type dopant if the detector is to be positively charged, with a n-type dopant if the detector is to be negatively charged, and is divided into two layers, a n-type doped layer and a p-type doped layer if it is desirable to charge the detector either negatively or positively. Boron is the preferred p-type dopant as it is easily obtainable from diborane gas, ($B_2H_6$), and phosphorus is the preferred n-type dopant. The concentration of dopant in the blocking layer should be at least about 100 ppm because less is ineffective, but more than about 2000 ppm is unnecessary and may form precipitates. The thickness of the blocking layer is typically about 0.05 to about 5 micrometers.

The photoconductive layer is also formed of hydrogenated amorphous silicon. Because amorphous silicon is normally slightly n-type, it is desirable to compensate for this by the addition of a p-type dopant to the photoconductive layer so that the concentration of acceptors and donors is about the same, i.e., the photoconductive layer is intrinsic. This minimizes the dark conductivity of the photoconductive layer. A concentration of p-type donors of about 5 to about 50 ppm is normally adequate to compensate for the slight n-type nature of amorphous silicon. Once again, boron is the preferred p-type dopant. The thickness of the photoconductive layer is preferably between about 5 and about 75 micrometers as thinner layers result in a high capacitance. To minimize the surface charge density, it is necessary to keep the capacitance low. If the photoconductive layer is too thick, the charges have difficulty migrating to the conductive substrate.

While the substrate, blocking layer, and photoconductive layer are somewhat conventional, the passivation layer is unique to this invention and is critical in its composition and thickness. The passivation layer somehow inhibits the movement of charges between the free surface of the element and the conductive substrate, thereby reducing dark decay. The passivation layer also functions as an anti-reflective layer which reduces the amount of light needed to discharge the element and form the electrostatic latent image. To perform these functions, the passivation layer must be on the opposite surface of the photoconductive layer from the blocking layer and cannot be on the same side of the photoconductive layer as the blocking layer or in between portions of the photoconductive layer. The two essential characteristics of the passivation layer are its high concentration of dopant and its thickness. The dopant concentration in the passivation layer must be at least 100 ppm in order to obtain the benefits of this invention, in particular, a reduced dark decay. However, if the concentration of dopant exceeds about 2000 ppm the conductivity of the element increases with the result that its charge acceptance decreases. A preferred dopant concentration range in the passivation layer is about 600 to about 1400 ppm. Thus, the dopant concentration in the passivation layer can be the same as the dopant concentration in the blocking layer, although the concentrations need not be the same; the structures of the two layers will be different, however, because they are made differently. If the element is to be positively charged, a p-type dopant is used, and if the element is to be negatively charged an n-type dopant is used. Once again, the preferred p-type dopant is boron and the preferred n-type dopant is phosphorus. As to the thickness of the passivation layer and its dopant concentration, the guiding principle is that the dopant concentration times the thickness must be less than the surface charge density. As a practical matter, this means that the thickness of the passivation layer should be between about 0.05 and about 0.5 micrometer as thinner passivation layers will not result in the benefits of this invention and thicker passivation layers result in reduced charge acceptance.

All three layers, the blocking layer, the photoconductive layer, and the passivation layer, are formed using plasma enhanced chemical vapor deposition. Ordinary chemical vapor deposition can not be used to form the detector of this invention because the temperatures required are such that crystalline silicon is formed. In plasma enhanced chemical vapor deposition, the conductive substrate is placed in a vacuum chamber and a potential, typically between about 100 and about 1000 volts, at a power of about 20 to about 50 mwatts/cm$^2$, is applied between the conductive substrate and an electrode, which is typically 5.1 cm from the substrate. Silane gas, $SiH_4$, and a dopant gas in an inert carrier gas are admitted to the vacuum chamber in between the element and the electrode at a typical pressure of about 0.11 to about 0.33 kPa and a flow rate of about 100 to about 300 sccm (standard cubic centimeters a minute). This process can be performed at low substrate temperatures (e.g., about 200° C.) and relatively quickly (about 2 micrometers per hour). It is preferable to form all three layers on the conductive substrate without interruption in between to prevent contamination of the layers as they are formed. This is accomplished by adjusting the concentration of dopant gas admitted to the space in between the element and the electrode.

When it is time to form the passivation layer on the photoconductive layer the flow rate of silane gas to the vacuum chamber of the plasma enhanced chemical vapor deposition apparatus is reduced to about 5 sccm or less, while preferably increasing the flow of the dopant gas a corresponding amount so that the total gas flow rate is about 5 to about 150 sccm; preferably, for best results, the flow rate of silane is reduced to zero. A lower total gas flow rate should be avoided because it may make the plasma less uniform, and a higher total gas flow rate should be avoided because it may result in too much dopant in the layer which could lower the charge acceptance. The total gas pressure is adjusted, if necessary, to about 0.11 to about 0.33 kPa; a lower total gas pressure should be avoided because the plasma may not be confined to the area of deposition, and a higher total gas pressure should be avoided because excessive heat is generated. The plasma power is adjusted, if necessary, to about 25 to about 150 mwatts/cm$^2$; less plasma power should be avoided because the plasma may not be maintained at less power, and greater plasma power should be avoided because the film may not adhere to the substrate. The substrate temperature is adjusted, if necessary, to about 190° to about 300° C.; lower and higher substrate temperatures should be avoided because the film may not adhere to the substrate. Operating within these process parameters alters the ionic species formed in the plasma, which gives the passivation layer its unique structure and properties. As the silane gas remaining in the vacuum chamber is consumed, the concentration of the dopant in the passivation layer increases, so that the concentration of the dopant in the passivation layer is at a minimum at the interface of the passivation layer with the photoconductive layer, and is at a maximum at the opposite side of the passivation layer.

While the flow of silane gas to the vacuum chamber is preferably terminated abruptly and completely, it can also be terminated in stages or in steps, or it can be only partially terminated to obtain other profiles of change in dopant concentration in the passivation layer. These other profiles have also been experimentally tested and have also been found to secure the advantages of this invention, provided that the concentration of dopant in the passivation layer falls within the limits specified and the required process parameters are adhered to. These other profiles include non-uniform increases in dopant concentration and increases followed by decreases. However, the preferred profile is a continuous increase in dopant concentration moving away from the photoconductive layer, which is obtained by the abrupt and complete shut off of the flow of silane gas to the vacuum chamber, as that profile is the easiest to obtain and other profiles do not seem to offer any advantage.

If desired, the passivation layer can be coated with a protective layer about 0.2 to about 2.0 micrometers thick to protect the passivation layer from mechanical damage. Suitable protection layers can be made of silicon carbide or silicon nitride by adding methane dopant or nitrogen or ammonia dopant, respectively, to the silane gas in the plasma enhanced chemical vapor deposition process as is known in the art.

The following examples further illustrate this invention.

EXAMPLE 1

A photoreceptor as shown in FIG. 1 was prepared using a DC plasma enhanced chemical vapor deposition system in which the plasma power was 50 mwatts/cm$^2$ and the substrate was at a cathode potential of −600 volts. A cylindrical aluminum substrate, 10.8 cm in diameter and 35.9 cm long, was surrounded by a coaxial aluminum tube at ground potential which served as the anode. The cathode temperature was 250° C. A blocking layer of p-type amorphous hydrogenated silicon about 0.5 micrometers thick containing about 200 ppm of boron was deposited on the aluminum substrate using a mixture of silane and diborane gases in an inert carrier gas of argon at a gas pressure of 0.26 kPa. Over this layer was deposited a 25 micrometer thick layer of a photoconductive layer of hydrogenated amorphous silicon which contained about 20 ppm of boron. The passivation layer was then deposited over the photoconductive layer by abruptly and completely shutting off the flow of silane while increasing the flow of diborane gas so that the total gas flow rate was 80 sccm. Other process parameters were maintained unchanged. This resulted in the formation of a passivation layer estimated to be about 0.5 micrometers thick containing a boron concentration of about 200 ppm at its maximum.

EXAMPLE 2

Using the same setup described in Example 1, a boron rich blocking layer estimated to be about 0.5 micrometers thick and having a boron concentration of 200 ppm was prepared using a gas flow of 22.5 sccm of pb 0.1% silane and 99.9% helium for 20 minutes at 600 volts and 60 milliamps. The photoconductive layer of hydrogenated amorphous silicon was deposited over the blocking layer without turning off the plasma. The photoconductive layer was made using a gas flow of 7.7 sccm of 10 ppm diborane and 600 sccm of 10% silane, both diluted with helium. The plasma power for the photoconductive layer was 50 mwatts/cm$^2$. The photoconductive layer was estimated to be 25 micrometers thick and contained 20 ppm boron. The passivation layer was made by abruptly and completely turning off the flow of silane and maintaining the system pressure of 0.16 kPa. The plasma flow was continued for an additional 15 to 20 minutes. The passivation layer was estimated to contain 1400 ppm boron and was estimated to be 0.25 micrometers thick. The element exhibited a charge acceptance of about 41 volts/micrometer and a dark decay of 22.7 volts/sec, compared to a charge acceptance level of about 20 volts/micrometer and a dark decay of 50 volts/sec for a similar element which did not have the boron-rich passivation layer.

EXAMPLE 3

In this experiment an aluminum cylinder of the type described in Example 1 had previously been coated with a blocking layer of p-type hydrogenated amorphous silicon 0.3 micrometers thick and containing 200 ppm boron, then overcoated with a hydrogenated amorphous silicon photoconductive layer, 18 micrometers thick and containing 20 ppm boron; the coated cylinder was noted to have a charge acceptance of about 16 volts/micrometer and a dark decay of 25 volts/sec. This element was then overcoated by deposition thereon of a passivation layer according to this invention by establishing an intrinsic depositing plasma and then suddenly shutting off the flow of silane while maintaining the 0.16 kPa pressure and other process parameters as described in Example 2. The passivation layer was 0.25 micrometers thick and contained 1000 ppm boron. This element exhibited a charge acceptance layer of about 23.5 volts/micrometer and a dark decay of 41 volts/sec. It is believed that the charge acceptance layer was not higher due to contamination of the surface before deposition of the passivation layer.

EXAMPLE 4

A previously deposited blocking layer estimated to be about 0.5 micrometers thick and containing 200 ppm boron and hydrogenated amorphous silicon photoconductive layer estimated to be about 6 micrometers thick and containing 30 ppm boron, on an aluminum substrate had a charge acceptance level of about 18 volts/micrometer and a dark decay of 52 volts/sec. The element was overcoated with a boron-rich passivation layer according to this invention by turning the silane level down to 5 sccm using a needle valve so that the total gas flow rate was 12.7 sccm. Other process parameters were maintained as in Example 3. The passivation layer was estimated to be about 0.2 micrometers thick and contained 800 ppm boron. The charge acceptance level of this element was found to have increased to about 28.7 volts/micrometer. Later, this element was coated with a SiC layer 0.10 micrometers thick and no significant change in the charge acceptance level was noted. The dark decay was 55.5 volts/sec.

EXAMPLE 5

A previously deposited blocking layer estimated to be about 0.5 micrometers thick and containing 200 ppm boron and photoconductive layer estimated to be 23 micrometers thick and containing 20 ppm boron, both of hydrogenated amorphous silicon, was tested and found to exhibit a charge acceptance level of 17.5 volts/micrometer and a dark decay of 60.4 volts/sec. A boron-rich passivation layer according to this invention was estimated to be about 0.4 micrometers thick and containing 1400 ppm boron was deposited thereon as described in Example 3 at a process pressure of 2.4 kPa. The charge acceptance layer of the final element was found to have increased to about 20.7 volts/micrometer and the dark decay reduced to 50.0 volts/sec.

INDUSTRIAL APPLICABILITY

The primary current detector of this invention is useful wherever dark currents are a source of noise and it is desirable to isolate the injection of currents form outside the detector. The three primary current detectors of greatest importance are photoreceptors, which are used primarily in electrostatographic copy machines, image sensors, and vidicons.

The invention has been described in detail with particular reference to preferred embodiments thereof, but it will be understood that variations and modifications can be effected within the spirit and scope of the invention.

I claim:

1. In a method of making a primary current detector by plasma enhanced chemical vapor deposition, where a conductive substrate is placed in a vacuum chamber and a gas mixture comprising a carrier gas, a dopant gas, and silane gas is passed through a plasma thereby forming on said conductive substrate, first a blocking layer which comprises doped hydrogenated amorphous silicon, then an intrinsic photoconductive layer which comprises hydrogenated amorphous silicon, the improvement which comprises thereafter, as necessary, adjusting the total gas pressure to about 0.11 to about 0.33 kPa, the plasma power to about 25 to about 150 mwatts/cm$^2$, and reducing the flow rate of said silane gas to said vacuum chamber to 0 to 5 sccm to produce a total gas flow rate of about 5 to about 150 sccm, so as to deposit on said photoconductive layer a passivation layer about 0.05 to about 0.5 micrometers thick which comprises hydrogenated amorphous silicon doped with about 100 to about 2000 ppm of a dopant.

2. An improvement according to claim 1 wherein said plasma enhanced chemical vapor deposition process is not interrupted in between the formation of said layers.

3. An improvement according to claim 1 wherein the product of the dopant concentration and the thickness of said dopant in said passivation layer is less than the charge density placed on said primary current detector.

4. An improvement according to claim 1 wherein said flow of said silane gas to said vacuum chamber is abruptly and completely terminated to form said passivation layer.

5. An improvement according to claim 1 wherein said dopant gas is diborane gas.

6. An improvement according to claim 5 wherein the concentration of boron in said passivation layer increases continuously from a minimum at the interface of said passivation layer with said photoconductive layer to a maximum at the opposite side of said passivation layer.

7. An improvement according to claim 1 wherein said blocking layer and said passivation layer are doped with p-type dopant.

8. An improvement according to claim 7 wherein said dopant is boron.

9. An improvement according to claim 1 wherein said blocking layer and said passivation layer are doped with an n-type dopant.

10. An improvement according to claim 9 wherein said dopant is phosphorus.

11. An improvement according to claim 1 wherein the concentration of said dopant in said passivation layer is about 600 to about 1400 ppm.

12. An improvement according to claim 1 wherein said substrate is a cylinder.

13. An improvement according to claim 1 wherein said substrate is aluminum.

14. An improvement according to claim 1 wherein said photoconductive layer is about 5 to about 75 micrometers thick and contains boron at a concentration of about 5 to about 50 ppm.

15. An improvement according to claim 1 wherein said blocking layer is about 0.05 to about 5 micrometers thick and is doped with boron at a concentration of about 100 to about 2000 ppm.

16. An improvement according to claim 1 wherein the temperature of said substrate is about 190° to about 300° C.

* * * * *